United States Patent [19]

Sullivan et al.

[11] 3,808,561

[45] Apr. 30, 1974

[54] DIRECTIONAL DIODE EXPANDER

[75] Inventors: Robert F. Sullivan, Silver Spring; Robert V. Garver, Boyds, both of Md.

[73] Assignee: The United States of America as represented by the Secretary of the Army, Washington, D.C.

[22] Filed: Nov. 29, 1967

[21] Appl. No.: 687,418

[52] U.S. Cl. ................ 333/17, 333/81 A, 333/81 B

[51] Int. Cl. ............................................ H04b 3/04

[58] Field of Search ........ 323/74; 333/81, 81 A, 24, 333/24.2, 17

[56] References Cited

UNITED STATES PATENTS

| | | | |
|---|---|---|---|
| 3,153,189 | 10/1964 | Sweeney | 333/17 X |
| 3,174,119 | 3/1965 | Jones et al. | 333/17 |
| 3,309,626 | 3/1967 | Higgins | 333/17 |

*Primary Examiner*—Maynard R. Wilbur
*Assistant Examiner*—Richard E. Berger
*Attorney, Agent, or Firm*—Edward J. Kelly; Herbert Berl

[57] ABSTRACT

A diode expander for use in applications in which bidirectional power flow is encountered, said expander having a varactor diode and a PIN diode so placed in a transmission line that, at medium power, power flows in one direction but not in the other. Both diodes will tend to give a high attenuation in the low power state and a low attenuation in the high power state. The varactor must be selected to be a better rectifier than the PIN diode. For forward medium power flow the varactor is encountered first rectifying the power and biasing the PIN diode into the low loss state. For reverse medium power flow the PIN diode will be first encountered. Because the PIN diode is selected to be a poorer rectifier than the varactor a higher threshold of transmission will exist in the direction of reverse power flow.

5 Claims, 3 Drawing Figures

INVENTORS
ROBERT V. GARVER
ROBERT F. SULLIVAN
BY Harry M. Saragovitz, Edward J. Kelly, Herbert Berl & G. L. Lett ATTORNEYS

DIRECTIONAL DIODE EXPANDER

The invention described herein may be manufactured, used, and licensed by or for the Government for governmental purposes without the payment to me of any royalty thereon.

BACKGROUND OF THE INVENTION

Frequently, in a variety of electronic circuits it is necessary to include a device that can produce an output voltage, the amplitude of which increases at a more rapid rate than the amplitude of the input voltage. One means of obtaining such an output is to use a nonlinear element such as a semiconductor diode. A diode performing this function is known as a diode expander. One possible application for such diode expanders is in the transmitter output arm of pulse doppler fuzes where they serve to enhance the signal-to-noise ratio. A well known technique for jamming a pulse doppler fuze is to direct toward it a signal of sufficient strength to capture a transmitter oscillator and force the oscillator into coherence with the jamming signal, and by this means a jammer is capable of dictating the phase or frequency of the signal transmitted by a fuze. It is therefore important to provide a means of isolating the transmitter oscillator from incoming signals, which can be done with an expander and furthermore it behooves the circuit designer to obtain the highest possible isolation from the expander should one be required.

It is therefore an object of this invention to provide a means for obtaining different threshold levels of transmission for different directions of propagation.

It is a further object of this invention to provide a diode expander with different threshold levels of transmission for different directions of propagation.

Still another object of this invention is to provide a means for isolating a transmitter oscillator from incoming signals by utilizing an expander which demonstrates directional properties.

SUMMARY OF THE INVENTION

The aforementioned and other objects of this invention may be obtained by using a diode expander utilizing a series combination of two diodes in which both diodes tend to give a high attenuation in the low power state and a low attenuation in the high power state. The directional properties herein discussed may be obtained in waveguide by placing therein diode switches in the appropriate manner. The first diode in a direction of forward propagation must be selected to be a better rectifier than the diode or diodes following. By this means in both directions of propagation in the low power state a high attenuation is maintained, but in the direction of forward propagation the attenuation decreases substantially with increasing power. However in the direction of reverse propagation a high attenuation is maintained until the higher power state is reached.

BRIEF DESCRIPTION OF THE DRAWINGS

The specific nature of the invention as well as other objects, aspects, uses, and advantages thereof will clearly appear from the following description and from the accompanying drawing in which.

DESCRIPTION OF A PREFERRED EMBODIMENT

Figure 1:
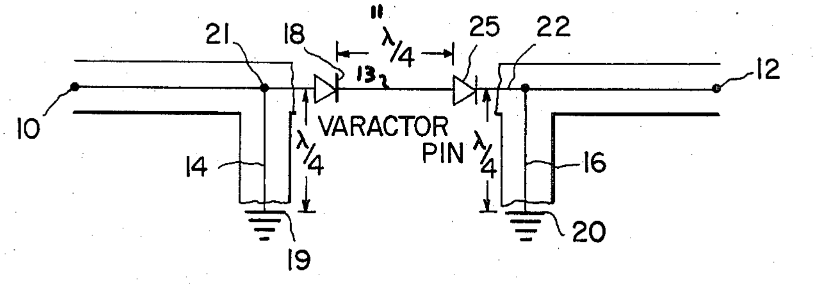
FIG. 1 is a schematic diagram of a first embodiment of the invention.

Referring to FIG. 1 there is shown a typical embodiment of our invention. Transmission line 11 is equipped with two ports 10 and 12 and forward propagation occurs when power flows from port 10 to port 12. In the center conductor of transmission line 11 a varactor 18 is connected in series with a PIN diode 25 by means of a quarter-wave length line 13. On each side of this series combination of diodes are quarter-wave length lines 14 and 16 connected directly to grounds 19 and 20, respectively. When low power is flowing in the direction of forward propagation both varactor 18 and PIN diode 25 will be capacitive. Because diodes 18 and 25 are separated by a quarter-wave length line 13, the attenuation produced by their capacitances will add, and each diode will introduce an attenuation of about 20 db with the total attenuation introduced into the line in a low power state being approximately 40 db. With increasing power varactor 18 will begin to conduct and provide a dc bias current for PIN diode 25. The path for the bias current is from varactor 18 through line 14, grounds 19 and 20, line 16, diode 25 and line 13. At this point, the reason for quarter-wave length lines 14 and 16 being so connected to the circuit becomes apparent. These lines provide a path for the dc current produced by varactor 18 but will be an open circuit for rf currents. When the bias current reaches approximately 10 milliamperes, PIN diode 25 will be biased into conduction providing low loss to high power entering port 10.

It can readily be seen that power entering port 12 will encounter greater difficulty. That is power entering port 12 must overcome PIN diode 25 first which, it will be remembered, was selected to be a much poorer rectifier than diode 18. Therefore the circuit will have a higher threshold of transmission for reverse propagation of power entering port 12.

Figure 2:
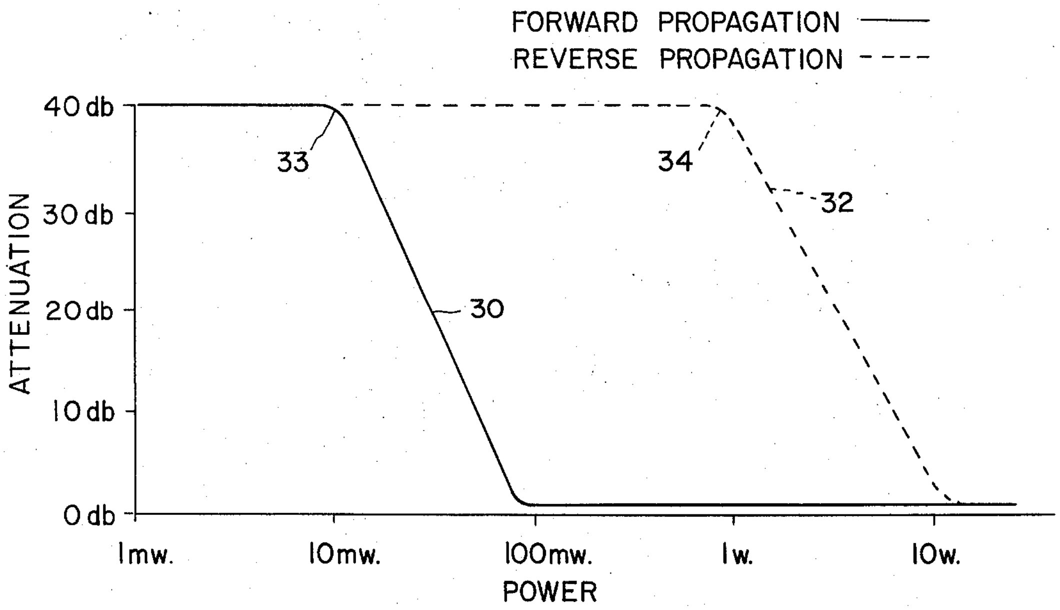
FIG. 2 is a characteristic curve of the operation of the embodiment of FIG. 1 depicting the different threshold levels of transmission for different directions of propagation.

In FIG. 2 is shown a curve 30 which is the conduction characteristic for forward propagation or for power flowing into port 10. The curve 32 is the conduction characteristic for reverse propagation or for power entering port 12. The threshold of conduction 33 for a forward propagation or when PIN diode 25 begins to conduct is at about 10 milliwatts with full conduction being reached at about 100 milliwatts. The higher treshold of conduction 34 for power entering port 12 occurs at about 1 watt with full conduction being reached near 10 watts. It has been found that the reverse propagation characteristic exhibits hysterisis properties.

Figure 3:
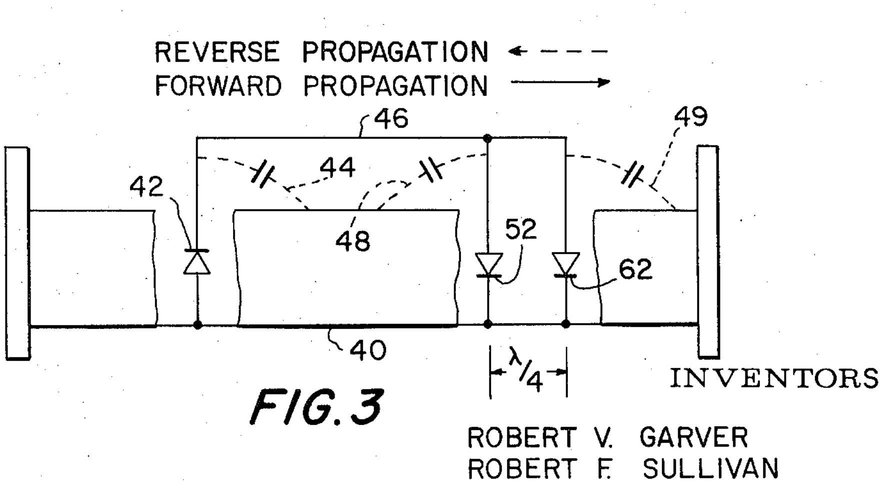
FIG. 3 is a side view of a second embodiment of the invention.

In FIG. 3 is shown a second embodiment of our invention in waveguide utilizing a detector instead of a varactor. In this case the detector is loosely coupled to the line and provides no significant expanding itself. In this embodiment diodes 42, 52 and 62 are mounted in a waveguide 40 in a manner similar to the normal diode switch mounting. The diodes are connected by a dc current path 46. Capacitances 44, 48 and 49 associated with diodes 42, 52 and 62, respectively, are the capacitances between the diode terminal and the waveguide wall. Diode 42 is particularly selected to be a good detector and to exhibit a detector characteristic far superior to diodes 52 and 62.

When low or medium power is flowing in the direction of reverse propagation diodes 52 and 62, placed a quarter-wave length apart, will be nonconductive because of their poor detector characteristics. It has been found that two diode switches placed a quarter-wave length apart while not conductive will reflect substantially all of the power impinging thereon. Therefore, substantially all of the low or medium power flowing in the direction of reverse propagation will be reflected.

Low and medium power flowing in a direction of forward propagation will first encounter diode 42 which was selected to be a good detector. This will result in a dc current being created by the microwave energy impinging upon diode 42 and flowing through line 46 to diodes 52 and 62. Diodes 52 and 62 will then be biased into conduction and will offer little resistance to the transmission of medium power in the direction of forward propagation in waveguide 40. Capacitances 44, 48 and 49 provide rf bypass for the dc circuit. The transmission characteristic for this circuit will be similar to that illustrated in FIG. 2.

It will be apparent that this directional diode expander may be used in other applications than the particular application described herein, that the embodiments shown are only exemplary and various modifications can be made in construction and arrangement within the scope of the invention as defined in the appended claims.

We claim as our invention:

1. A microwave power transmission device having two ports and including a means for providing different threshold levels of conduction for different directions of propagation, said means comprising:

a. a first diode means and a second diode means, said second diode means being selected to have a poorer recitification characteristic than said first diode means;

b. said first and second diode means being placed within said transmission device in a spaced relation such that power flowing in one direction will encounter said first diode means before said second diode means and power flowing in an opposite direction will encounter said second diode means before encountering said first diode means; and c. a circuit means for providing a dc current path between said first and said second diode means, whereby when microwave power is flowing into said transmission device in said one direction it will impinge upon said first diode means causing a dc current to flow from said first diode means to said second diode means and when microwave power enters said transmission device from said opposite direction it will encounter said second diode means and will be substantially reflected until relatively higher power levels are used.

2. The power transmission device of claim 1 in which said second diode means comprises two diode switches having a poorer rectification characteristic than said first diode means, said two diode switches being connected in parallel.

3. A diode expander having different thresholds of conduction for different directions of propagation, comprising:

a. a first port and a second port, b. a first diode, c. a second diode, said second diode being selected to have a poorer rectification characteristic than said first diode, d. a transmission line connecting said first and said second diode in series, said series combination of diodes being connected in series between said first port and said second port, and e. a dc current circuit means for allowing a dc current to flow between said first and said second diodes, while excluding rf current from said dc circuit.

4. The diode expander of claim 3 in which the dc circuit means comprises a grounded quarter-wave length transmission line connected in parallel between said first port and said first diode, a second grounded quarter-wave length transmission line connected in parallel between said second diode and said second port and said transmission line connecting said first and said second diode in series.

5. The diode expander of claim 4 in which said first diode is a varactor and said second diode is a PIN diode.

* * * * *